United States Patent
Balamurugan

[19]

[11] Patent Number: 6,156,625
[45] Date of Patent: Dec. 5, 2000

[54] PARTIAL SEMICONDUCTOR WAFER PROCESSING USING WAFERMAP DISPLAY

[75] Inventor: Subramanian Balamurugan, Plano, Tex.

[73] Assignee: Texas Instruments Incorporated, Dallas, Tex.

[21] Appl. No.: 09/262,554

[22] Filed: Mar. 4, 1999

Related U.S. Application Data

[60] Provisional application No. 60/077,220, Mar. 7, 1998.
[51] Int. Cl.[7] .......................... H01L 21/46; H01L 21/78; H01L 21/301; G01C 17/38; G01P 21/00
[52] U.S. Cl. ........................ 438/462; 438/460; 438/973; 438/975; 702/95; 221/209
[58] Field of Search ................................ 438/113, 460, 438/464, 462, 973, 975; 702/95; 221/209; 382/151

[56] References Cited

U.S. PATENT DOCUMENTS

| | | | |
|---|---|---|---|
| 4,914,601 | 4/1990 | Smyth | 364/490 |
| 4,972,311 | 11/1990 | Holdgrafer | 364/167.01 |
| 5,355,212 | 10/1994 | Wells | 345/237 |
| 5,362,681 | 11/1994 | Roberts | 437/226 |
| 5,798,947 | 8/1998 | Ye | 361/589 |

*Primary Examiner*—Charles Bowers
*Assistant Examiner*—Nema Berezny
*Attorney, Agent, or Firm*—Robert L. Troike; Frederick J. Telecky, Jr.

[57] ABSTRACT

Partial wafer processing is achieved by down loading the wafer map of the whole wafer from a host (2) and display the whole wafer in the die bonder monitor (3) move the wafer table to a first die pickup position (4) and move the display cursor to the first die pickup position (5) and teach two limit die coordinates in X direction (6) and teach two limit die coordinates in Y direction (7) and then using limit die coordinates as information remove other partial wafer die coordinates from the map (8) and select die pickup sequence (9).

4 Claims, 10 Drawing Sheets

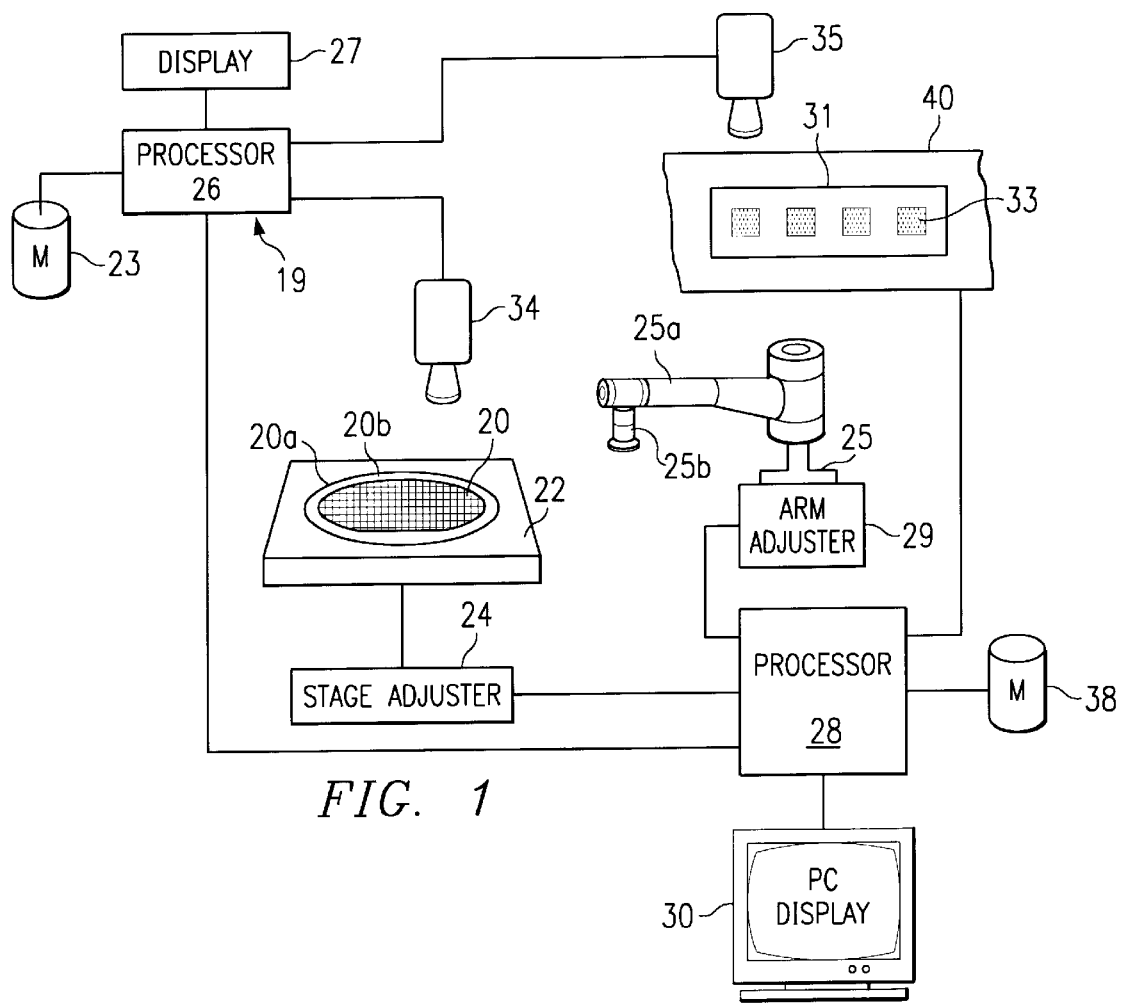
FIG. 1
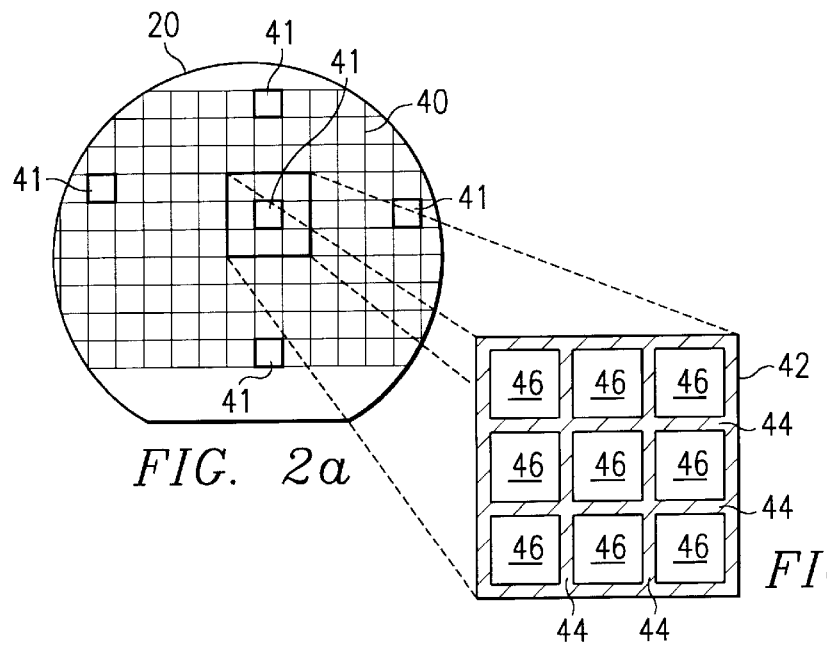
FIG. 2a
FIG. 2b

PARTIAL SEMICONDUCTOR WAFER PROCESSING USING WAFERMAP DISPLAY

This application claims priority under 35 USC § 119(e)(1) of provisional application No. 60/077,220, filed Mar. 7, 1998.

TECHNICAL FIELD OF THE INVENTION

This invention relates to semiconductor wafer processing and more particularly to partial wafer processing in die bonders for wafermap operations.

RELATED CO-PENDING APPLICATION

This invention is related to application Ser. No. 08/667,246 filed Jun. 20, 1996 entitled, "Method and Apparatus for Aligning the Position of Die on a Wafer Table, " of Balamurugan. This application is incorporated herein by reference.

BACKGROUND OF THE INVENTION

Semiconductor manufacturing includes the process of die attached performed by a die bonder or die attach machine. The basic operation of die bonder is to mount dies on lead frames. The die bonder deposits epoxy on the lead frame pad, picks up a die, and places it on the lead frame die pad. The epoxy is a historic term and is actually an adhesive which uses no catalyst.

The die is picked up by suction. The good dies are individually picked up and placed on a lead frame. To do this the location of the die must be precisely known so the machine can pick up the die.

The silicon wafer provides several patterns, to form a plurality of semiconductor circuits. The individual integrated circuits on the wafer are separated by horizontal and vertical thoroughfares. The thoroughfares are border spaces between the semiconductor devices on the wafers. Along these thoroughfares are formed the saw streets when a cutter passes through them separating the individual circuits into what is termed "dies". This process is referred to as sawing. Before cutting the separate circuits, the back of the wafer is placed on a double backed tape which in turn is stretched like a drum over a ring base called flexframe on a controllable wafer table. The location of the dies on the original wafer is recorded on the wafer map stored in a memory. After sawing the wafer, the dies are moved. Hence moving the wafer table per the wafer map coordinates does not accurately position the wafer table for the next die to be picked. Small die wafer map operation on die bonder equipment is not feasible because of this. The variation in the saw street width across the wafer coupled with the tape shrinkage on partially picked wafers makes the one time correction of table jump distance for street width variation ineffective in ensuring the accurate table position.

A reference die is required to process a full wafer. Sometimes it is desirable to only use part of a wafer for a particular job and store away the remaining for later use.

SUMMARY OF THE INVENTION

In accordance with one embodiment of the present invention the reference coordinates and the reference position of a partial section of a given wafer is identified using a wafermap display. The wafer table is moved to a first die position and the cursor of the display is moved to the first die position to get the coordinates of the first die position.

These and other features of the invention that will be apparent to those skilled in the art from the following detailed description of the invention, taken together with the accompanying drawings.

DESCRIPTION OF THE DRAWINGS

FIG. 1 is a diagram of the system according to one embodiment of the present invention;

FIGS. 2a, 2b illustrates a prior art wafer and thoroughfares on a wafer;

DETAILED DESCRIPTION OF THE INVENTION

Figure 3:
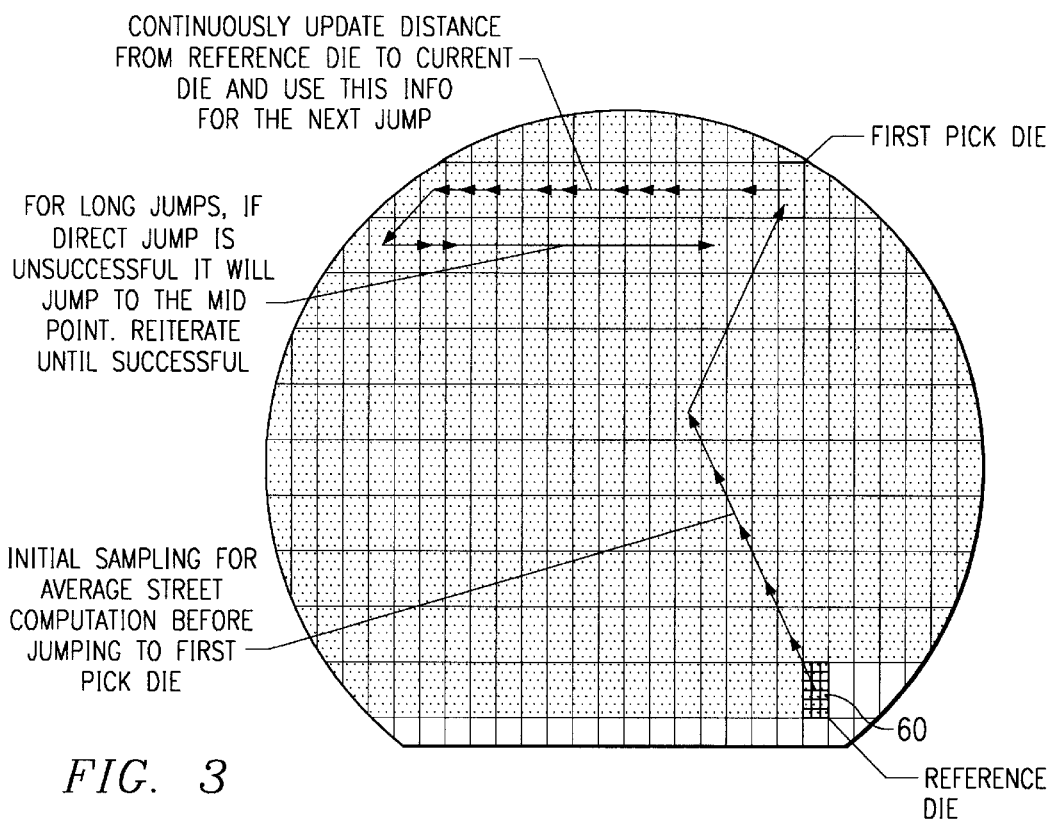
FIG. 3 illustrates a prior art wafer with a reference index.

Referring to FIG. 1, there is illustrated a schematic representation of an alignment system using a die bonder (die mounter or die attach) that may be used in the fabrication process of integrated circuits on silicon wafers according to the present invention. The die bonder may be, for example, Abacus IIID-SA Die Bonder of Texas Instruments Incorporated. A die bonder dispenses epoxy on a die pad of a lead frame and mounts the die to the pad. A silicon wafer 20 is carried by a table 22 which is moveable in conjunction with a table adjuster 24, which is coupled to table 22. A robot 25 of the system, including a controllable arm 25a and suction end effector 25b, picks up the die and places the die and on pad 33 of lead frame 31 by arm adjuster 29. The robot 25 is controlled by processor 28. The lead frame handling system 40 moves and positions the lead frame to allow placement of the die. The lead frame handling system 40 also applies the epoxy to the pad 33 of lead frame 31 before the die is placed on the lead frame 31. The wafer table 22 via the adjuster 24 moves the wafer 20 to locate the next die under program control of processor 28 so that robot arm 25a picks up the die from wafer 20 and places it on pad 33 of lead frame 31. After the table 22 is moved to one good die the align system 19 takes over for good alignment initiated by processor 28. The align system 19 consists of a processor 26, display 27, storage device 23, camera 34, and camera 35. The align system 19 provides an align correction signal to align a die accurately and is coupled to processor 28. During the alignment process, an output signal is produced by processor 26 and, the output signal may be delivered to the table adjuster 24 through processor 28 so as to reposition the wafer table in response to an output signal. The substance of the output signal may also be displayed by the processor 26 on the display 27. In order to perform the alignment or misregistration check, processor 26 receives a video image from a video camera 34 (such as a CCD camera) which is a subsystem of the alignment system. The camera includes the optics to focus on the wafer or lead frame. The video signal is digitized using, for example, a video to digital converter as part of the camera. Whenever an alignment is made, the processor 26 takes a picture via the camera 34 and looks for a pre-taught (stored) pattern. In one embodiment a unique pattern is in the die and is stored and when an alignment call is made the align system takes a picture and looks for that pattern. In another embodiment the align system takes a picture and aligns to the four sides (streets) of the die. The pattern of the integrated circuit is taught or stored in a memory of the processor 26 or memory or storage 23 at the time the device is setup. The processor 26 calculates the displacement of the stored pattern (alignment point) to current pattern and provides a correction signal. This displacement in x and y direction is the x and y correction. This correction signal dependent on the correction value through processor 28 is sent to the wafer table adjuster 24 from processor 26 for accurately positioning of the table so the die is picked up. If the displacement is too great so the stored pattern to current pattern is too great the align system 19 will not be able to do the alignment. It is therefore very important that before alignment is done, the wafer table 22 is moved close to the alignment point. The precise location of the lead frame 31 may be determined by align system 19 using a second camera 35 (such as a C.CD video camera)also coupled to the processor 26. The wafer map identifying the locations of the dies and which dies are good or bad are stored in the wafer map in storage 38. When bad dies have been identified they are marked and the information is stored in the storage 38 so that the system coupled to the storage knows the bad dies and skips or jumps these bad dies. The align system 19 gives the correct distance to the wafer table adjuster 24 to move the table 22 if not aligned sufficiently for the pickup device to pick up the die. The robot arm 25*a* picks up the properly aligned die and places it on the pad of the lead frame. The lead frame handling system 40 then moves the next lead frame pad into position. The present application is particularly directed to the step of accurately moving the wafer table to every good die on the wafer so that the align system 19 can align the die properly and enable the robot arm 25 to pick up the good dies.

Referring to FIG. 2*a* there is shown silicon wafer 20 with a reducible layout 40 shown there on. An exploded section 42 shown in FIG. 2*b* shows four scribe line segments 44 defining chips 46. Although the pattern formed by the described segments shown in exploded section are uniform, it is to be understood that an exploded view on most all wafers would contain unique line segments. The line segments 44 are thoroughfares extending to both horizontal and vertical directions separating the separate integrated circuits or chips 41. The wafers before being cut are stuck on a double-backed tape 20*b* and the tape 20*b* is stretched over a support ring 20*a* as illustrated in FIG. 1. As the cutter passes through the thoroughfares 44 the saw streets are formed which separates the individual die pieces or chips. After the cutting of the wafer, the variation in saw street width coupled with the tape shrinkage due to pulling on the tape, the wafer table jump may not be accurate. This is particularly true for large jumps between good dies. The saw street width vary across the wafer in both axes due to uneven wafer mount tape expansion, saw blade variations, etc. There is also a change in distance between the dies, due to shrinkage of the tape on which the wafer is mounted, as the dies are picked off the wafer. After the sawing or cutting has occurred, the align system 19 and the processor 28 compute the average saw street width in both the horizontal and vertical axes.

Figure 4:
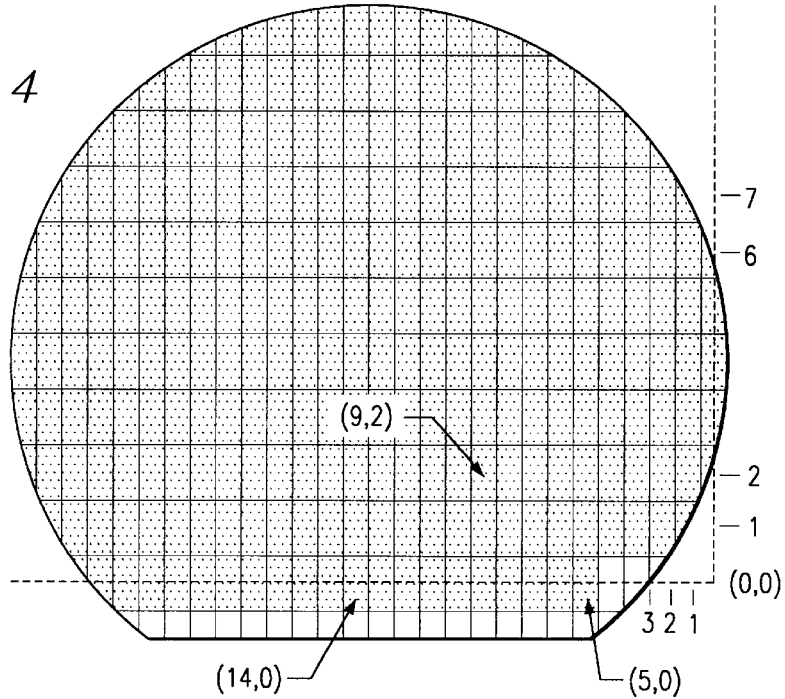
FIG. 4 illustrates wafer map coordinates.

The present invention modifies the current system to allow for partial wafers. As illustrated in FIG. 3, a traditional wafer map system uses a single fixed reference point. This reference die may be identified by the right most fully patterned die in the first row next to the blanks. FIG. 4 illustrates wafer map coordinates. If the wafer is separated, then all pieces (partial) except one will be without reference points, making wafer map processing impossible. The present invention provides reference position and reference coordinates for each partial wafer and enables processing of partial wafers using wafermapping.

Figure 5:
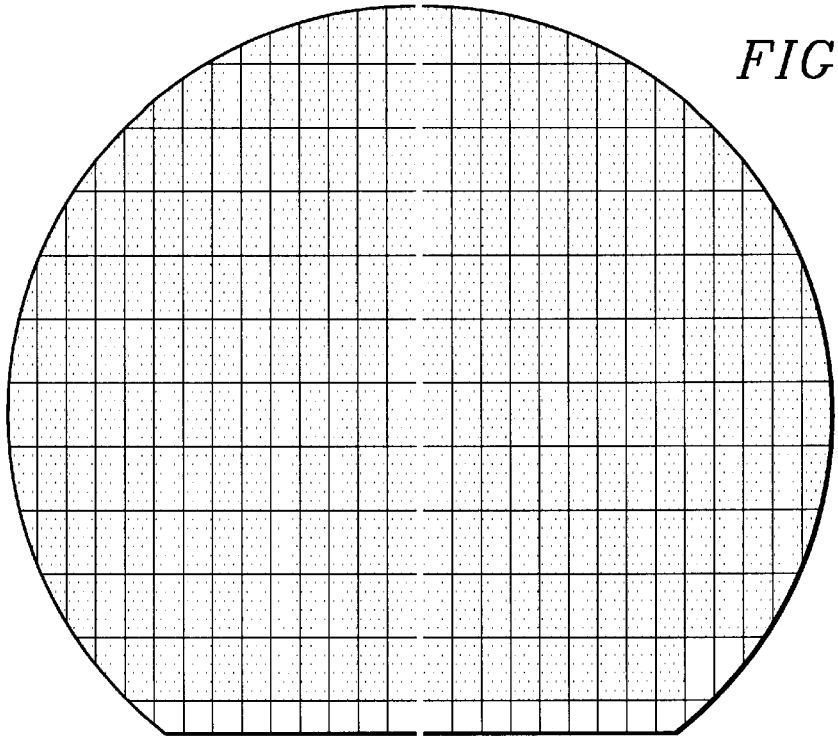
FIG. 5 illustrates half partial wafers.
Figure 6:
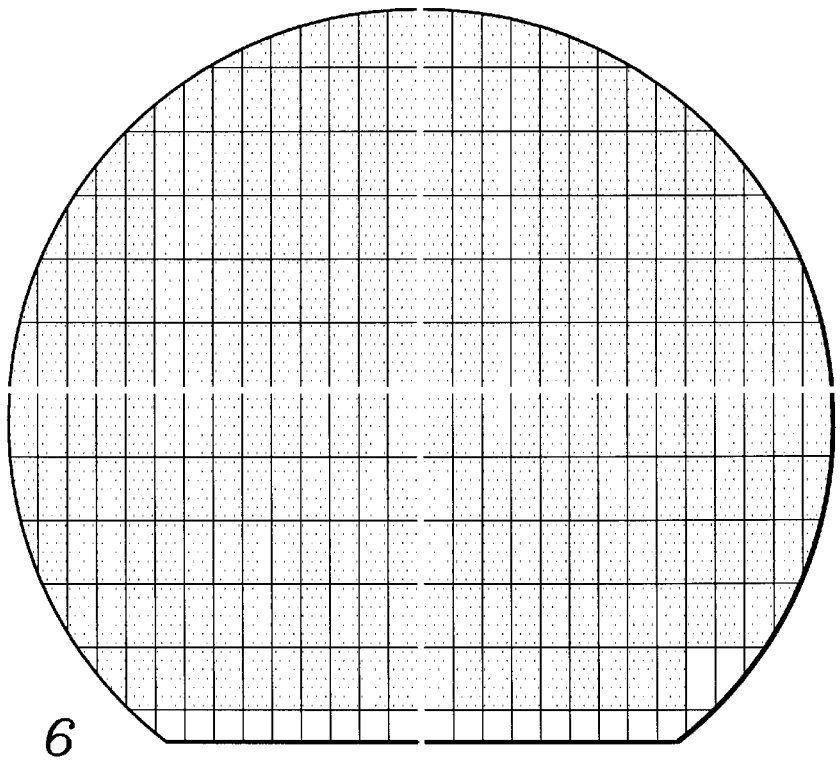
FIG. 6 illustrates quarter partial wafers.
Figure 7:
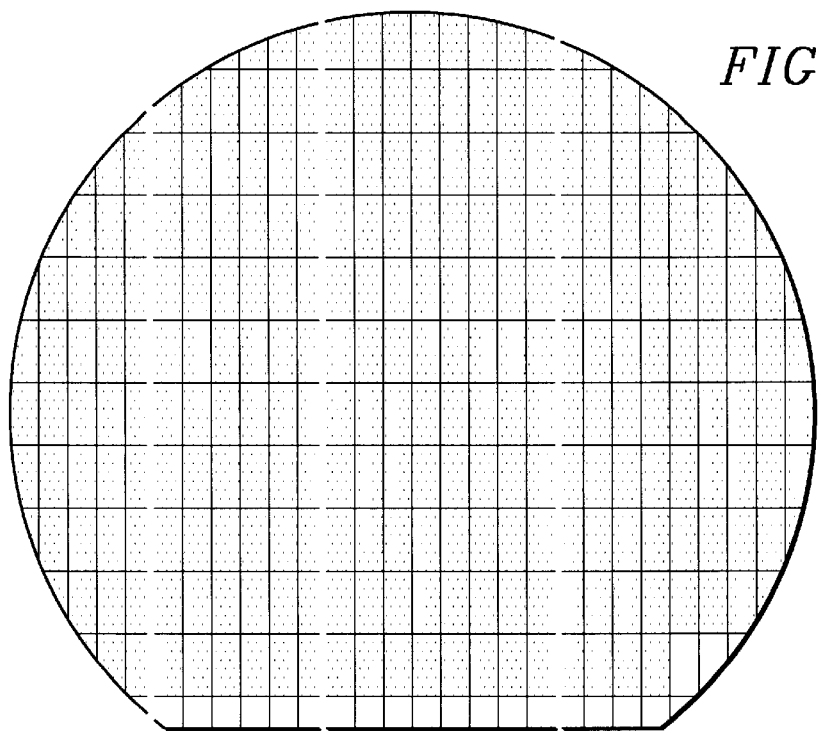
FIG. 7 illustrates partial wafers in different sizes.
Figure 8:
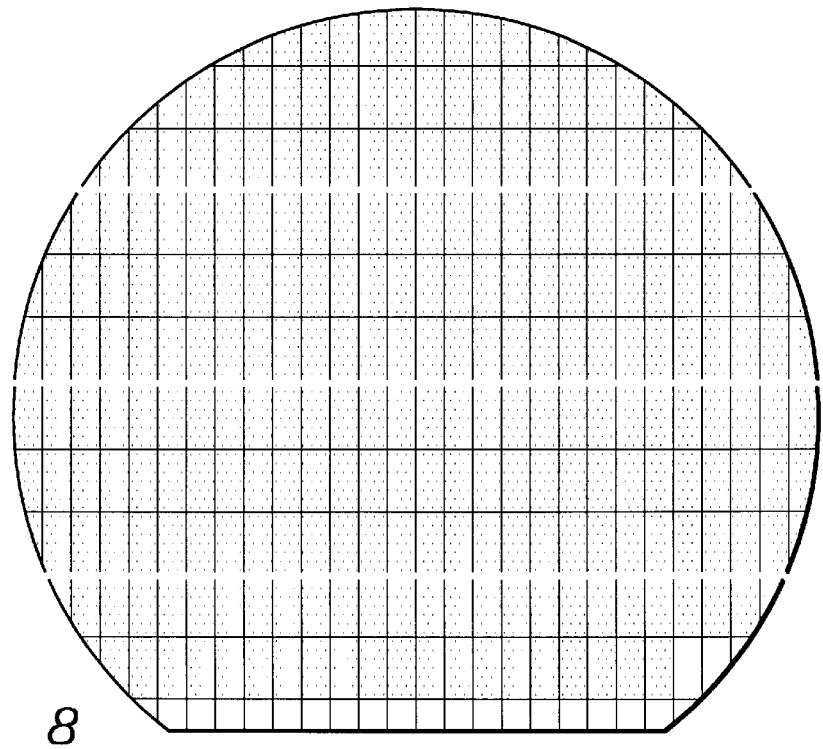
FIG. 8 illustrates partial wafers in different sizes.
Figure 9:
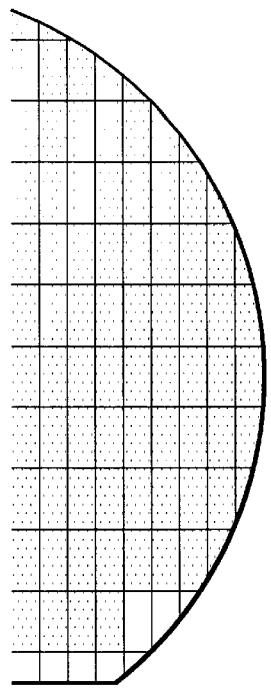
FIG. 9 illustrates a partial wafer to be processed to illustrate the invention.

FIG. 5, illustrates the half partial wafers. FIG. 6, illustrates the quarter partial wafers. FIG. 7, illustrates the partial wafers in different sizes. FIG. 8, illustrates the partial wafers in different sizes. FIG. 9 illustrates the partial wafer to be processed in accordance with one example.

Figure 10:
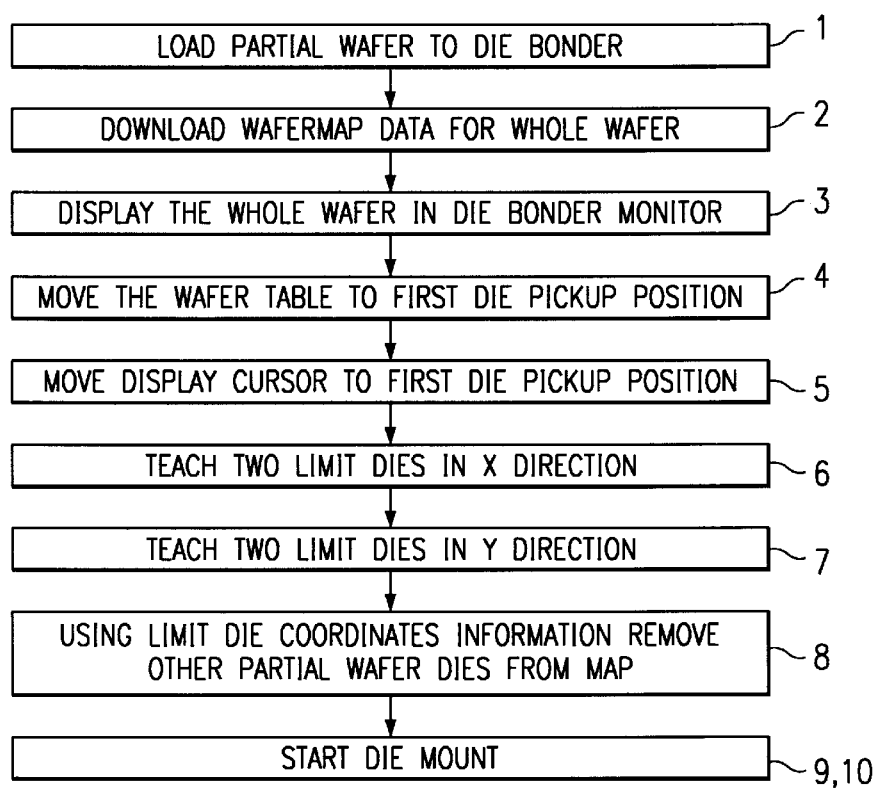
FIG. 10 is a flow chart for partial wafer processing.

Referring the FIG. 10, there is illustrated a flow chart for the processor in FIG. 1 for partial wafer processing.

The Following Assumption are Made for the Partial Wafer Processing.

Figure 11:
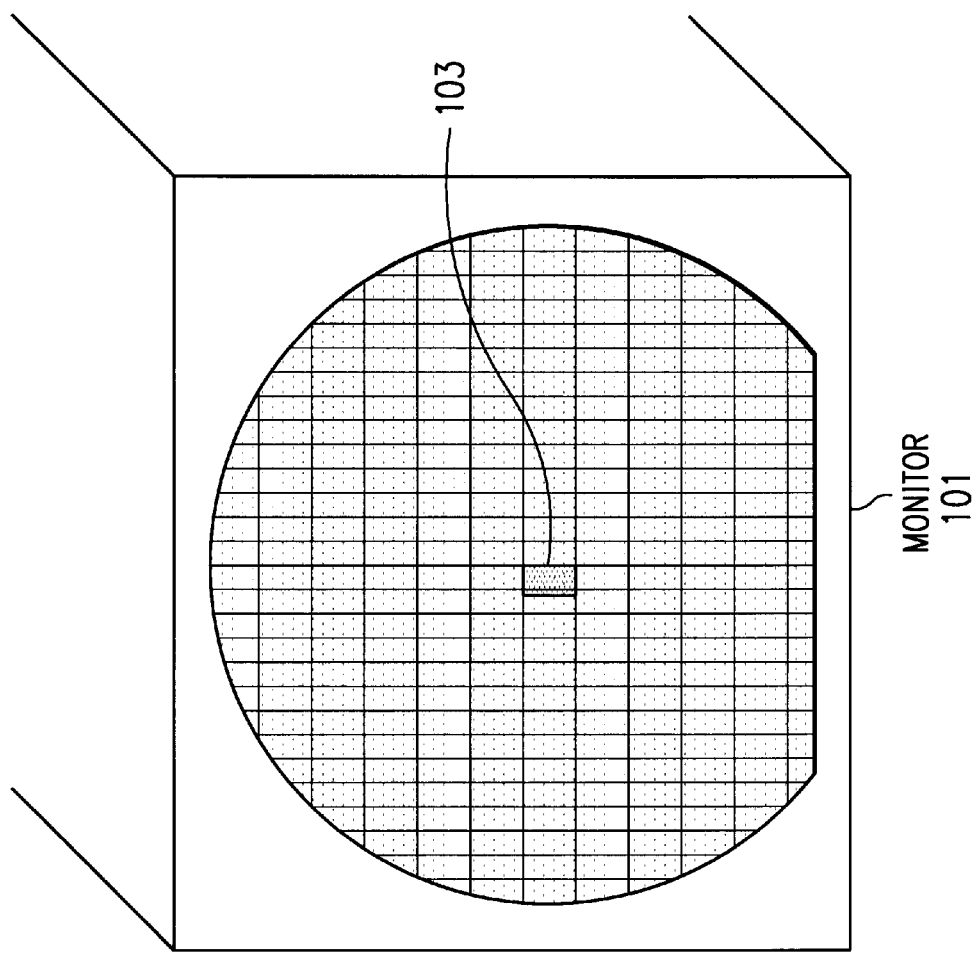
FIG. 11 illustrates Die Bonder monitor displaying whole wafer.
Figure 11:
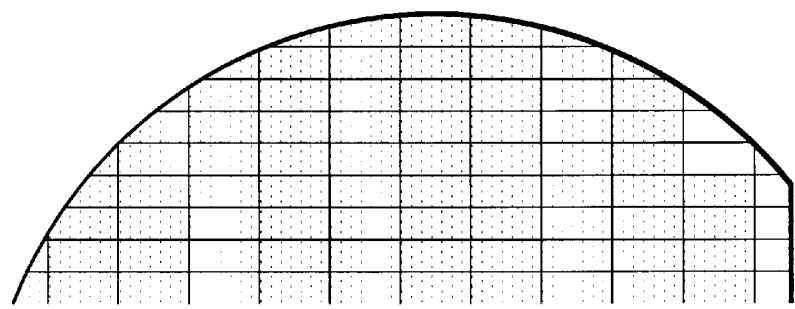

1. Die Bonder monitor 101 displays the full wafer graphically (wafermap display). See FIG. 11.
2. There is a display cursor 103 in the wafermap display to move to any location of the wafer. See FIG. 11.

The following steps illustrated in FIG. 10 are based on the zero degree of wafer rotation angle. The same steps are also used for different rotation angles.

Step 1: Load partial wafer into Die Bonder (after Saw) (FIG. 9).

Step 2: Download wafermap data for the whole wafer from wafermap data host.

Step 3: Die Bonder monitor 101 displays the whole wafer using wafermap data (Wafermap display). See FIG. 11.

Figure 12:
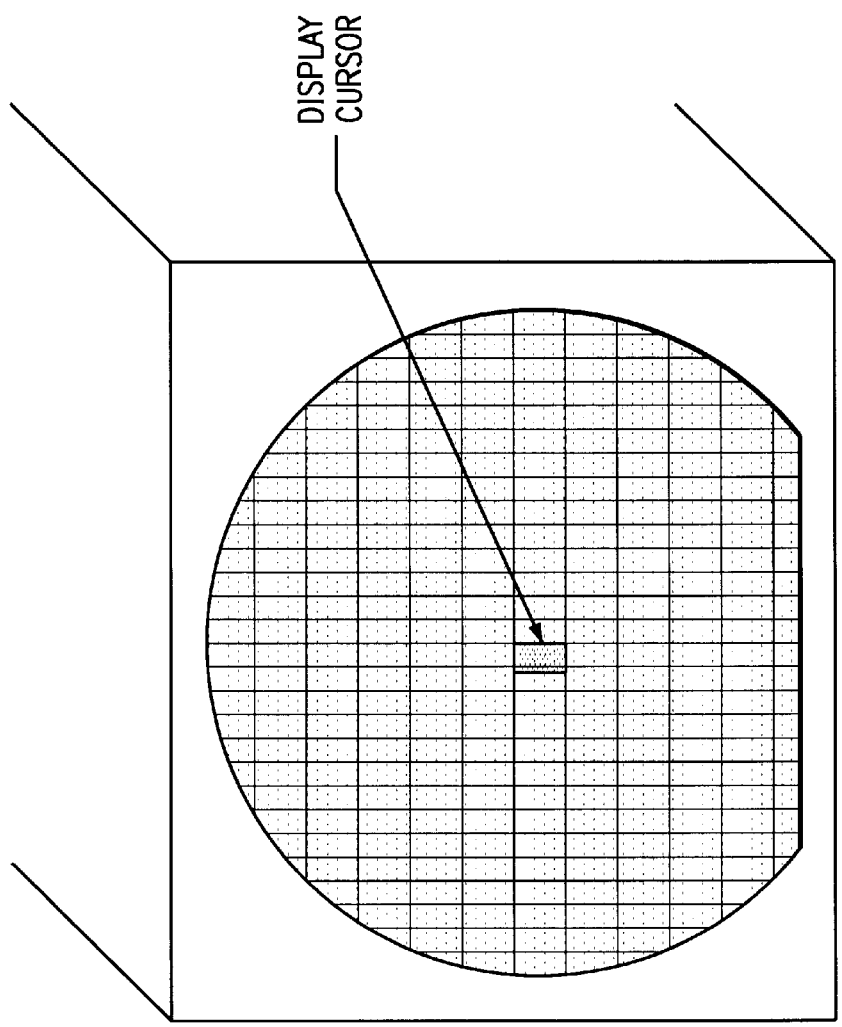
FIG. 12 illustrates moving wafer table to pickup die position.
Figure 12:
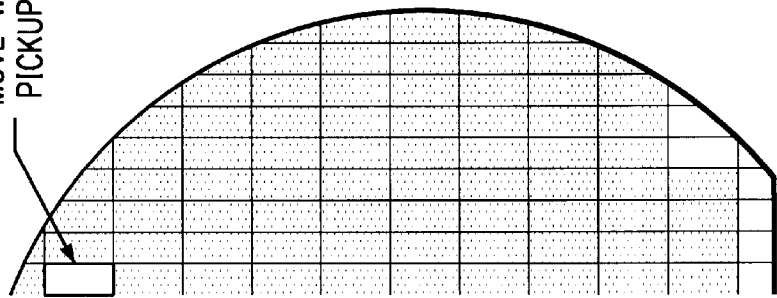

Step 4: Move the wafer table to the first die pickup position. See FIG. 12. This can be any die in the partial wafer. After moved to a die position then the system (wafer table) knows the physical position of the die. Now it requires the coordinates of the die.

Figure 13:
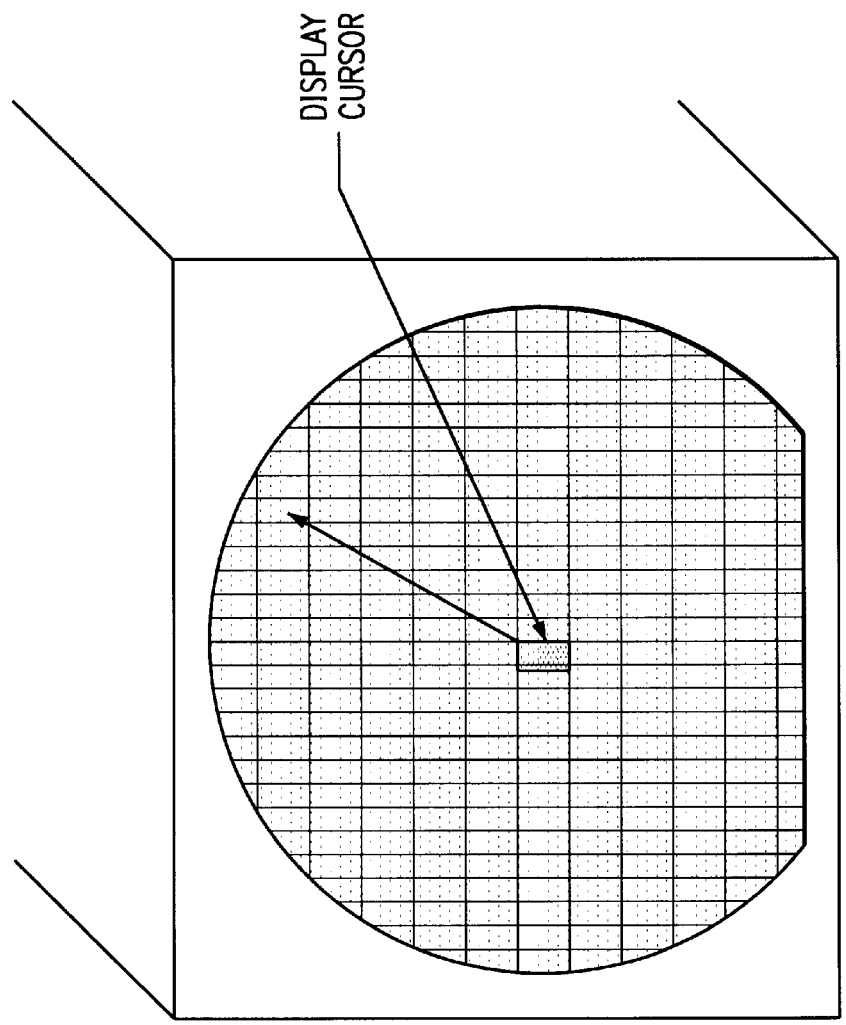
FIG. 13 illustrates moving display cursor to pickup die position.
Figure 13:
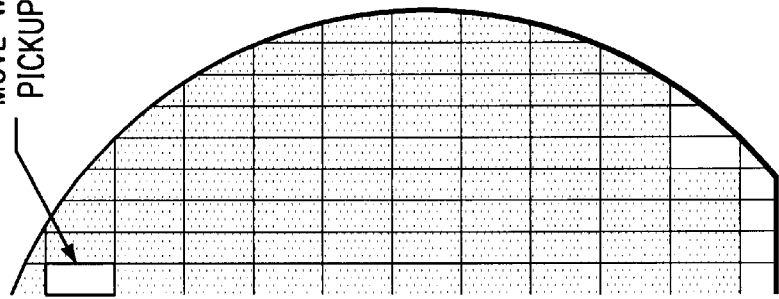

Step 5: Move the display cursor on the wafermap display to the first die pickup position and inform system (wafer table) of the first die pickup position (from step 4). See FIG. 13. The wafermap display will show the whole wafer and the display cursor will show the coordinates of each die in the wafer. When the cursor is moved to the first die pickup position, the system is informed of the first die pickup coordinates (wafer table). The display will give the coordinates of the die selected. Now the system (wafer table) understands the coordinates of the first die picking position.

Figure 14:
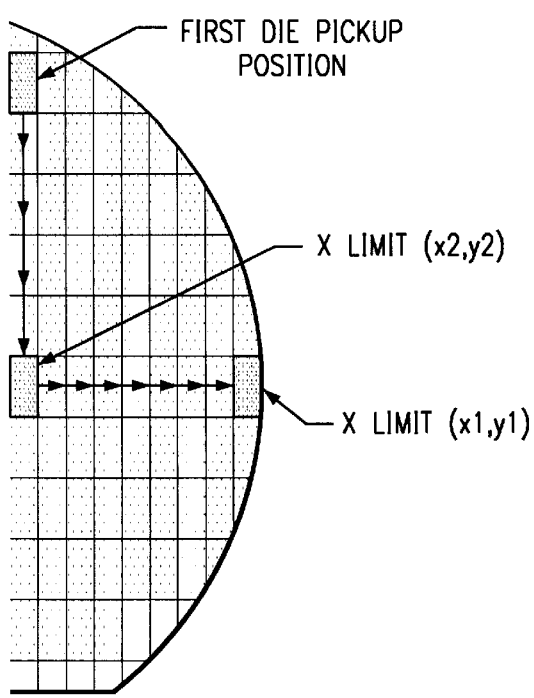
FIG. 14 illustrates partial wafer X limits.

Step 6: Teach two limit die coordinates (x1,y1) and (x2,y2) in X direction by moving the wafer table one step at a time until any one edge point. Each step that the wafer table is moved the wafer table knows the position and coordinates. See FIG. 14. The limit dies are the dies in the edge of the partial wafer. The use of the limit dies in the system is to know the edge of the wafer in wafermap coordinates. The limit point in the X direction are determined in the example wafer by following the edge to x2,y2 and going to the right to edge x1,y1 farthest from the edge.

Figure 15:
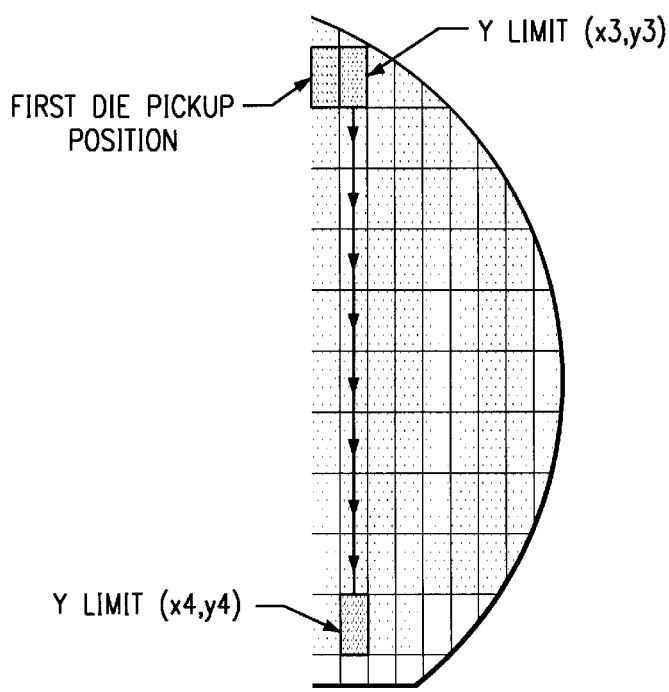
FIG. 15 illustrates partial wafer Y limits.

Step 7: Teach two limit die coordinates (x3,y3) and (x4,y4) in Y direction by moving the wafer table one step at a time until any edge point. See FIG. 15. The first die picking position goes to x3,y3 and then by limit to x4,y4.

Step 8: Using limit die coordinates information remove other partial wafer dies from the map.

Avoid all moves to dies in other partial wafers as follows:

1. The limit die coordinates (x1,y1), (x2,y2), (x3,y3) and (x4,y4) are known.
2. Keep all dies in the map which has the x coordinate in between x1 and x2 (inclusive of x1 and x2).
3. Keep all dies in the map which has the y coordinate in between y3 and y4 (inclusive of y3 and y4).

Figure 16:
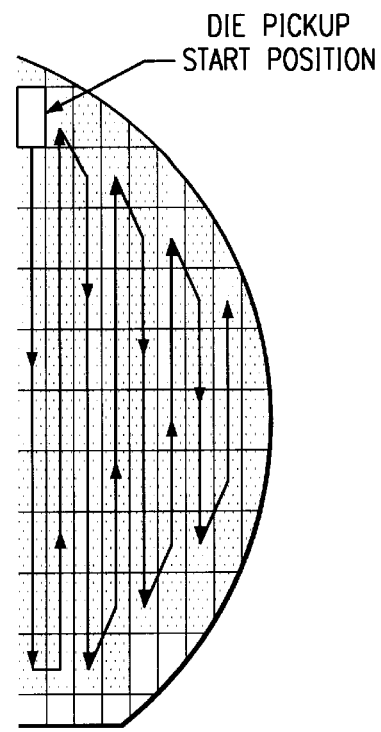
FIG. 16 illustrates Y-Scan and right.
Figure 17:
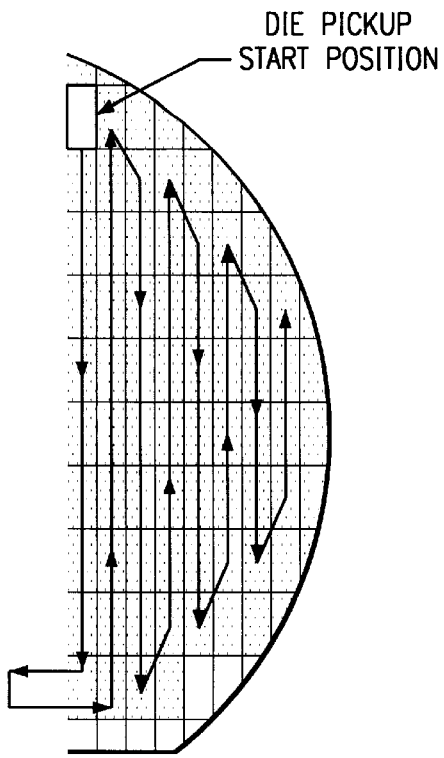
FIG. 17 illustrates Y-Scan and left.
Figure 18:
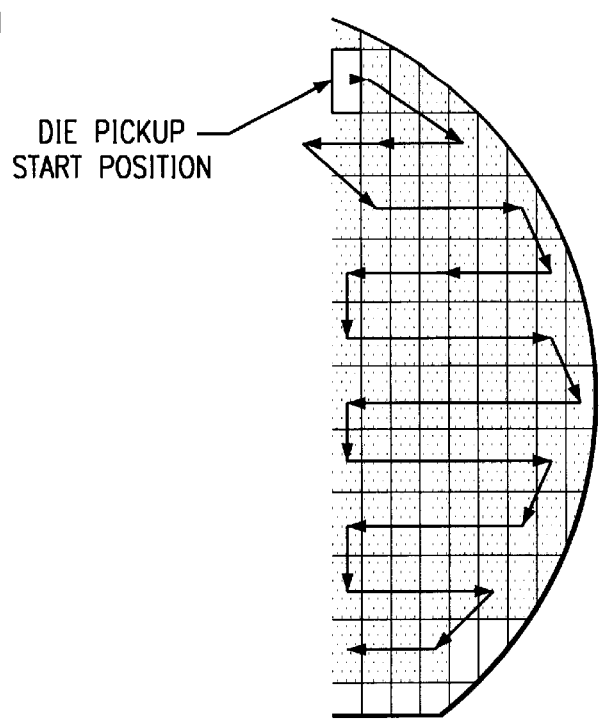
FIG. 18 illustrates pickup sequence X-Scan and right.
Figure 19:
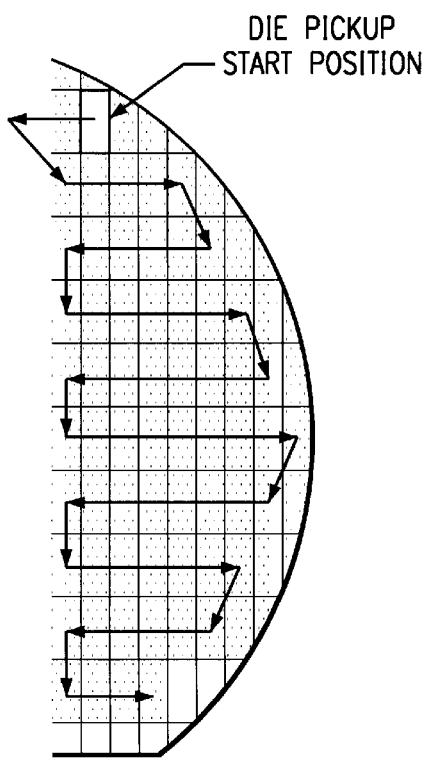
FIG. 19 illustrates pickup sequence X-Scan and left.

Step 9: Select the die pickup sequence. X direction or Y direction. See FIG. 16 for Y-scan and right, FIG. 17 for Y-scan and left, FIG. 18 for X-scan and right and FIG. 19 for Y-scan and left.

Step 10: Start die mount.

The process identifies a reference die coordinates and reference die position to process each partial wafer.

Although the present invention and its advantages have been described in detail, it should be understood that various changes, substitutions and alterations can be made herein without departing from the spirit and scope of the invention as defined by the appended claims.

What is claimed is:

1. A method of processing a partial wafer in die bonders containing dies comprising the steps of:

loading said partial wafer to a wafer table on a die bonder;

displaying map of whole wafer in a die bonder monitor;

moving wafer table containing partial wafer to first die pickup position;

moving cursor of said monitor to the first die pickup position to get coordinates of first die pickup position;

determining limit points of the dies in said partial wafer;

removing other partial wafer dies from said map using said limit points; and mounting said partial wafer dies using said map.

2. The method of claim 1 including the step after loading the partial wafer of:

downloading wafer map data for the whole wafer map from a data host to the die bonder monitor.

3. The method of claim 1 wherein the step of determining limit points includes learning limit die coordinates in X and Y directions by moving wafer table.

4. The method of claim 1 wherein after determining limit points the step of using limit points removing other partial wafer die coordinates from said map.

* * * * *